US011011291B2

(12) United States Patent
Noguchi et al.

(10) Patent No.: US 11,011,291 B2
(45) Date of Patent: May 18, 2021

(54) LAMINATED ELECTRONIC COMPONENT

(71) Applicant: Murata Manufacturing Co., Ltd., Kyoto (JP)

(72) Inventors: Yutaka Noguchi, Nagaokakyo (JP); Takeshi Kobayashi, Nagaokakyo (JP); Makoto Yamamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 492 days.

(21) Appl. No.: 15/711,366

(22) Filed: Sep. 21, 2017

(65) Prior Publication Data

US 2018/0090255 A1 Mar. 29, 2018

(30) Foreign Application Priority Data

Sep. 26, 2016 (JP) .............................. JP2016-187244

(51) Int. Cl.
*H01F 5/00* (2006.01)
*H01F 17/00* (2006.01)
(Continued)

(52) U.S. Cl.
CPC ..... *H01F 17/0013* (2013.01); *H01F 17/0033* (2013.01); *H01F 17/04* (2013.01);
(Continued)

(58) Field of Classification Search
USPC .................................. 336/200, 232, 192, 83
See application file for complete search history.

(56) References Cited

U.S. PATENT DOCUMENTS 6,114,936 A * 9/2000 Yamamoto ............ H01F 27/292
336/192
2011/0285494 A1 * 11/2011 Jeong .................. H01F 17/0013
336/200
(Continued)

FOREIGN PATENT DOCUMENTS

JP S62-029886 B2 6/1987
JP 2012-256758 A 12/2012
(Continued)

OTHER PUBLICATIONS

An Office Action dated by the Chinese Patent Office May 8, 2019, which corresponds to Chinese Patent Application No. 201710866212.1 and is related to U.S. Appl. No. 15/711,366 with English language translation.

(Continued)

*Primary Examiner* — Shawki S Ismail
*Assistant Examiner* — Kazi S Hossain
(74) *Attorney, Agent, or Firm* — Studebaker & Brackett PC

(57) ABSTRACT

A laminated electronic component having a coil formed in a laminated body of pluralities of laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via a conductor extending in a lamination direction of the laminated body.

(Continued)

An insulator part is disposed between the conductor and the coil.

10 Claims, 8 Drawing Sheets

(51) Int. Cl.
*H01F 17/04* (2006.01)
*H01F 27/29* (2006.01)
*H01F 27/32* (2006.01)
*H05K 3/46* (2006.01)

(52) U.S. Cl.
CPC ........... *H01F 27/29* (2013.01); *H01F 27/292* (2013.01); *H01F 27/324* (2013.01); *H01F 2017/004* (2013.01); *H01F 2017/0066* (2013.01); *H05K 3/4629* (2013.01)

(56) References Cited

U.S. PATENT DOCUMENTS

| | | | | |
|---|---|---|---|---|
| 2014/0176286 | A1* | 6/2014 | Okada | H01B 3/12 336/200 |
| 2016/0247623 | A1* | 8/2016 | Marusawa | H01F 17/04 |

FOREIGN PATENT DOCUMENTS

| | | |
|---|---|---|
| JP | 2013-045985 A | 3/2013 |
| JP | 5190331 B2 | 4/2013 |
| JP | 2014-022426 A | 2/2014 |
| JP | 2016-186963 A | 10/2016 |
| JP | WO 2017014065 A1 * | 1/2017 |
| WO | 2017/014065 A1 | 1/2017 |

OTHER PUBLICATIONS

An Office Action; "Notification of Reasons for Refusal," dated by the Japanese Patent Office Feb. 19, 2019, which corresponds to Japanese Patent Application No. 2016-187244 and is related to U.S. Appl. No. 15/711,366; with English language translation.

* cited by examiner

LAMINATED ELECTRONIC COMPONENT

CROSS-REFERENCE TO RELATED APPLICATIONS

This application claims priority to Japanese Patent Application No. 2016-187244, filed on Sep. 26, 2016, the disclosure of which is hereby incorporated by reference in its entirety.

TECHNICAL FIELD

The present disclosure relates to a laminated electronic component having a coil formed in a laminated body.

BACKGROUND

As shown in FIGS. 5 and 6, conventional laminated electronic components include a component having a coil formed in a laminated body by laminating magnetic material layers 51A to 51F and conductor patterns 52A to 52E and by spirally connecting the conductor patterns 52A to 52E between the magnetic material layers with lead-out ends of the coil led out to longitudinal-direction side surfaces of the laminated body so that the coil is connected between external terminals 55, 56 formed on the longitudinal-direction side surfaces of the laminated body and four surfaces adjacent to these side surfaces.

In recent years, because of miniaturization and higher functionality of mobile devices on which this kind of electronic components is mounted, the number of electronic circuits required for these devices has increased and an area of a mounting board has become smaller. Accordingly, electronic components used for these devices are required to be reduced in size and thickness. Additionally, lower voltages are increasingly used in these devices, so that inductors used in these devices are required to be further improved in DC superposition characteristics. Furthermore, minimization of land patterns for mounting and minimization of distance between adjacent electronic components are performed on mounting boards of these devices so as to mount the electronic components at higher density, and inductors to be mounted on the mounting boards of these devices must be mounted at high density.

One method of improving DC superimposition characteristics of an inductor is to use a material with a high maximum magnetic flux density for a magnetic material constituting an element body of the inductor. Although the conventional laminated electronic components typically have a laminated body made of ferrite, the maximum magnetic flux density of ferrite is as low as about 0.4 T. Therefore, the conventional laminated electronic components have a problem that magnetic saturation easily occurs when a large current is applied. To solve such a problem, the material of the laminated body is switched from ferrite to a metal magnetic material having a high saturation magnetic flux density so as to improve the DC superimposition characteristics (see, e.g., Japanese Laid-Open Patent Publication No. 2013-45985).

However, a metal magnetic material has a lower volume resistivity of material and a lower withstand voltage as compared to ferrite. Therefore, to ensure the insulation and the withstand voltage of the inductor in the conventional laminated electronic components, it is necessary to ensure a sufficient distance between external terminals and to ensure a sufficient distance between positions causing a potential difference, so that it is difficult to achieve sufficient miniaturization. To solve such a problem, the volume resistivity and the withstand voltage are improved by covering a surface of a laminated body having a coil formed therein with ceramics etc. having a high withstand voltage (see, e.g., Japanese Patent No. 5190331).

The conventional laminated electronic components have external terminals formed on the longitudinal-direction side surfaces of the laminated body and four surfaces adjacent to these side surfaces and therefore have a problem that a solder bridge is formed between the external terminals of adjacent electronic components due to a solder fillet at the time of mounting and soldering on a mounting board, a positional displacement of a mounting position at the time of mounting on the mounting board, etc., causing a short circuit. Therefore, it is difficult to mount the electronic components on a mounting board on which the components are mounted at a high density as described above. To solve such a problem, a laminated electronic component having external terminals formed on the longitudinal-direction side surfaces of the laminated body and four surfaces adjacent to these side surfaces is covered with an insulator film except a bottom surface (see, e.g., Japanese Laid-Open Patent Publication No. 2012-256758).

On the other hand, as shown in FIGS. 7 and 8, magnetic material layers 71A to 71E are provided with conductor patterns 72A to 72E and conductors 73, 74 penetrating the magnetic material layers, and a coil is formed in a laminated body by laminating the magnetic material layers 71A to 71F and the conductor patterns 72A to 72E and by spirally connecting the conductor patterns 72A to 72E between the magnetic material layers in the laminated body provided with the conductors 73, 74 such that both ends of the coil are led out by the conductors 73, 74 to a bottom surface of the laminated body and connected to external terminals 75, 76 formed on the bottom surface of the laminated body (see, e.g., Japanese Examined Patent Application Publication No. 62-29886).

SUMMARY

The present disclosure provides a laminated electronic component having a coil formed in a laminated body of pluralities of alternately laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via a conductor extending in a lamination direction of the laminated body. An insulator part is disposed between the conductor and the coil.

DETAILED DESCRIPTION

Figure 1:
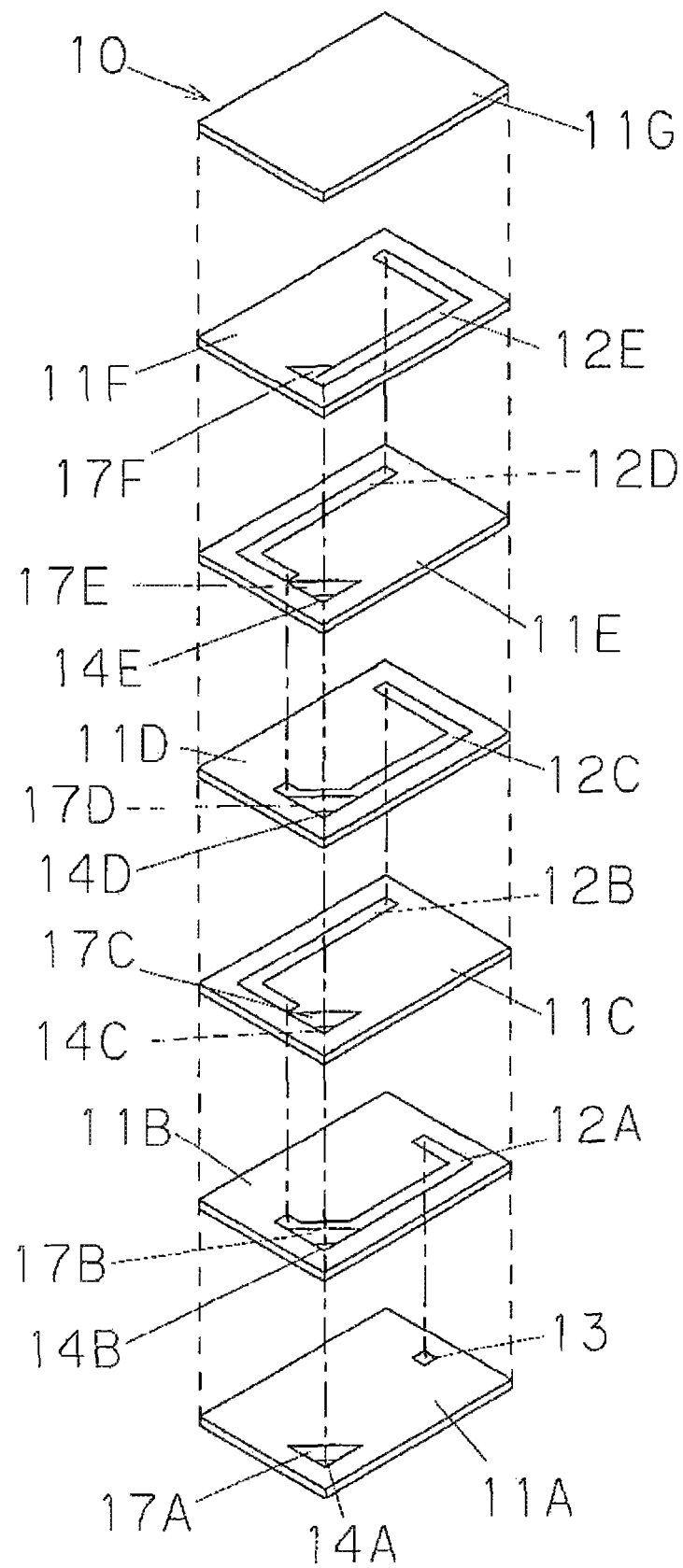
FIG. 1 is an exploded perspective view of a first embodiment of a laminated electronic component of the present disclosure.

However, in the laminated electronic component described in Japanese Laid-Open Patent Publication No. 2012-256758, since the thickness of the insulator film is added to the element dimension, the shape of the laminated body must be made smaller by the thickness of the insulator film, and the component has a problem that the desired inductance and DC superimposition characteristics are difficult to ensure. In the laminated electronic component described in Japanese Examined Patent Application Publication No. 62-29886, a sufficient distance must be ensured between the coil and the conductors so as to ensure insulation and withstand voltage in the laminated body, and the component has a problem that the desired inductance and DC superimposition characteristics are difficult to ensure. Furthermore, since such a conventional laminated electronic component has the conductors disposed in the laminated body such that both ends of the coil are connected to the external electrodes, it is difficult to ensure a sufficient magnetic flux passing area in the laminated body as compared to the conventional laminated electronic component shown in FIGS. 6 and 7, and the component has a problem that a desired inductance is not acquired or, even if the desired inductance is acquired, it is difficult to ensure the DC superimposition characteristics without increasing the resistance value of the coil.

It is an object of the present disclosure to solve these problems and to provide a laminated electronic component using a metal magnetic material, having excellent DC superimposition characteristics and higher insulation and withstand voltage characteristics, and suitable for high-density mounting.

The present disclosure provides a laminated electronic component having a coil formed in a laminated body by laminating magnetic material layers and conductor patterns and by connecting the conductor patterns between the magnetic material layers, wherein the magnetic material layers are made of a metal magnetic material, wherein the coil has two lead-out ends respectively led out to a bottom surface of the laminated body and connected to a pair of external terminals formed on the bottom surface of the laminated body, and wherein an insulator part is formed between the coil and a conductor connecting the lead-out end of the coil distant from the bottom surface of the laminated body to the external terminal.

In other words, the present disclosure provides a laminated electronic component which includes a coil, a laminated body and an insulator part. The coil is formed in the laminated body of pluralities of alternately laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via a conductor extending in a lamination direction of the laminated body. The insulator part is disposed between the conductor and the coil.

The present disclosure also provides a laminated electronic component having a coil formed in a laminated body by laminating magnetic material layers and conductor patterns and by connecting the conductor patterns between the magnetic material layers. The magnetic material layers are made of a metal magnetic material. The coil has two lead-out ends respectively led out to a bottom surface of the laminated body and connected to a pair of external terminals formed on the bottom surface of the laminated body. An insulator part is formed between the coil and the external terminals.

In other words, the present disclosure also provides a laminated electronic component which includes a coil, a laminated body and an insulator part. The coil is formed in the laminated body of pluralities of alternately laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body. The insulator part is disposed between the conductor pattern having the first end portion and at least one of the first external terminal and the second external terminal.

The laminated electronic component of the present disclosure has a coil formed in a laminated body by laminating magnetic material layers and conductor patterns and by connecting the conductor patterns between the magnetic material layers. The magnetic material layers are made of a metal magnetic material. The coil has two lead-out ends respectively led out to a bottom surface of the laminated body and connected to a pair of external terminals formed on the bottom surface of the laminated body. An insulator part is formed between the coil and a conductor connecting the lead-out end of the coil distant from the bottom surface of the laminated body to the external terminal. Therefore, the laminated electronic component has excellent DC superimposition characteristics and high insulation and withstand voltage characteristics and can be mounted at high density on a mounting board.

The laminated electronic component of the present disclosure has a coil formed in a laminated body by laminating magnetic material layers and conductor patterns and by connecting the conductor patterns between the magnetic material layers. The magnetic material layers are made of a metal magnetic material. The coil has two lead-out ends respectively led out to a bottom surface of the laminated body and connected to a pair of external terminals formed on the bottom surface of the laminated body. An insulator part is formed between the coil and the external terminals.

Therefore, the laminated electronic component has excellent DC superimposition characteristics and high insulation and withstand voltage characteristics and can be mounted at high density on a mounting board.

A laminated electronic component of the present disclosure has a coil formed in a laminated body by laminating magnetic material layers made of a metal magnetic material and conductor patterns and by connecting the conductor patterns between the magnetic material layers. The laminated body has a bottom surface orthogonal to a lamination direction and having an external terminal disposed thereon and a side surface adjacent to the bottom surface and parallel to the lamination direction. In the coil, both lead-out ends are led out via respective conductors to the bottom surface of the laminated body and respectively electrically connected to a pair of external terminals formed on the bottom surface of the laminated body. An insulator part is formed between the coil and the conductor electrically connecting the lead-out end (second end portion) of the coil distant from the bottom surface of the laminated body to the external terminal, or between the coil and the external terminal.

Therefore, the laminated electronic component of the present disclosure has no external terminal on the side surface of the laminated body, so that no solder fillet is formed on the side surface at the time of soldering to a mounting board.

Figure 7:
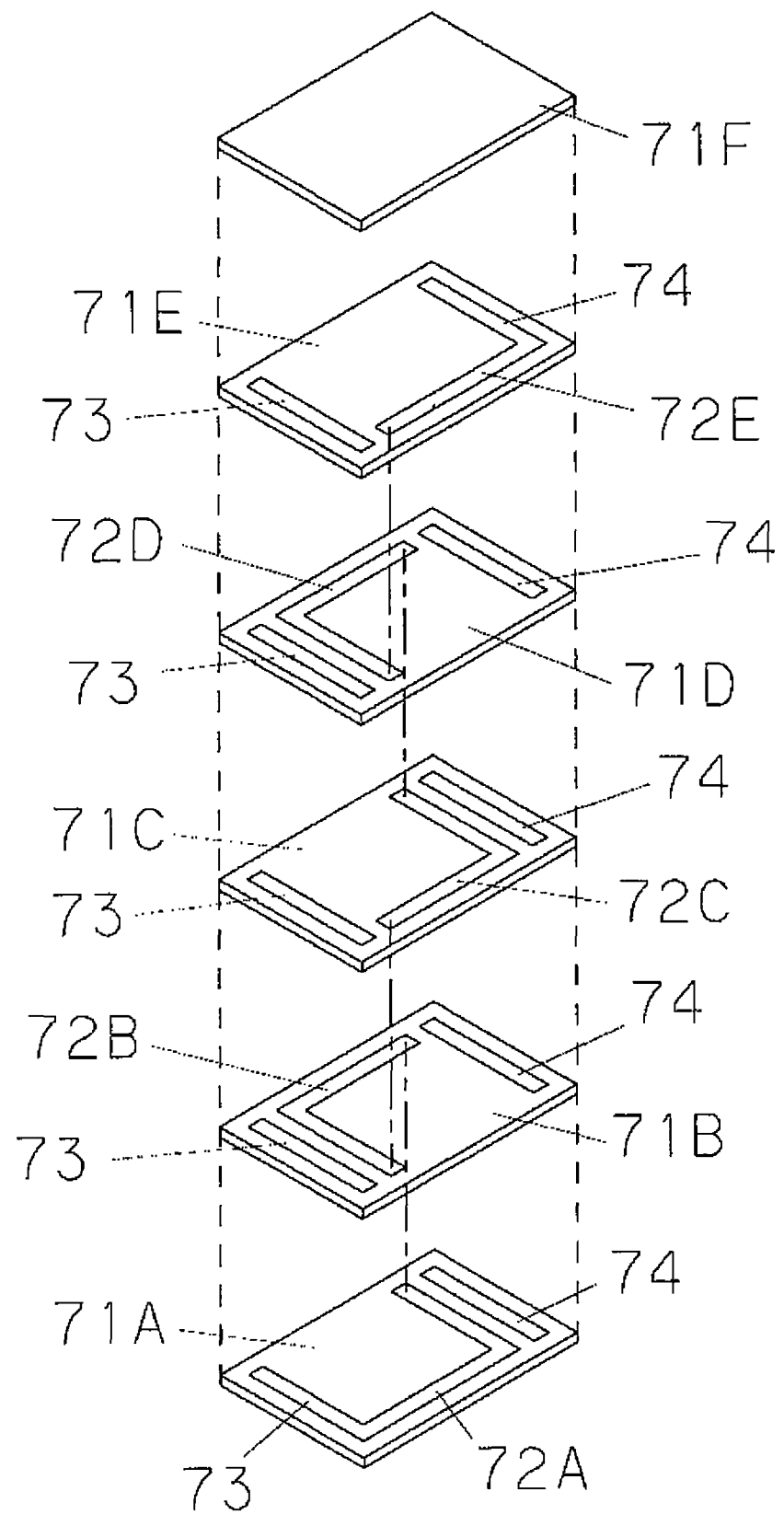
FIG. 7 is an exploded perspective view of another conventional laminated electronic component.
Figure 8:
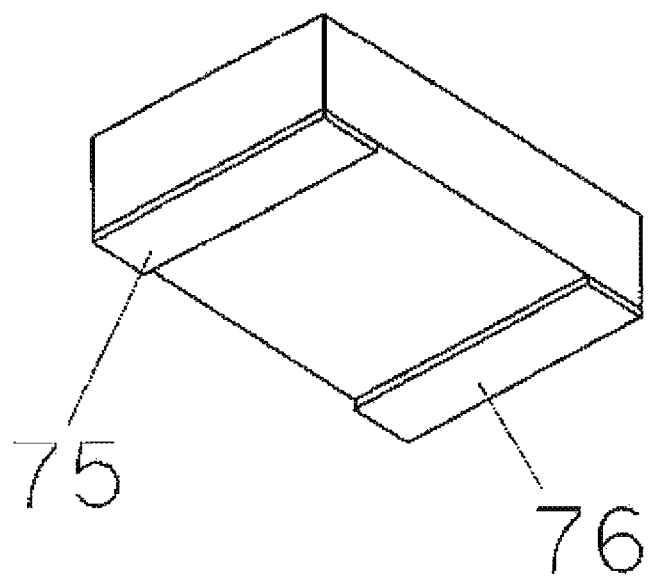
FIG. 8 is a perspective view of the other conventional laminated electronic component.

In the laminated electronic component of the present disclosure, the electric distance between positions causing a potential difference and the magnetic flux passing area in the laminated body can be made larger than those of the conventional laminated electronic component shown in FIGS. 7 and 8.

Figure 5:
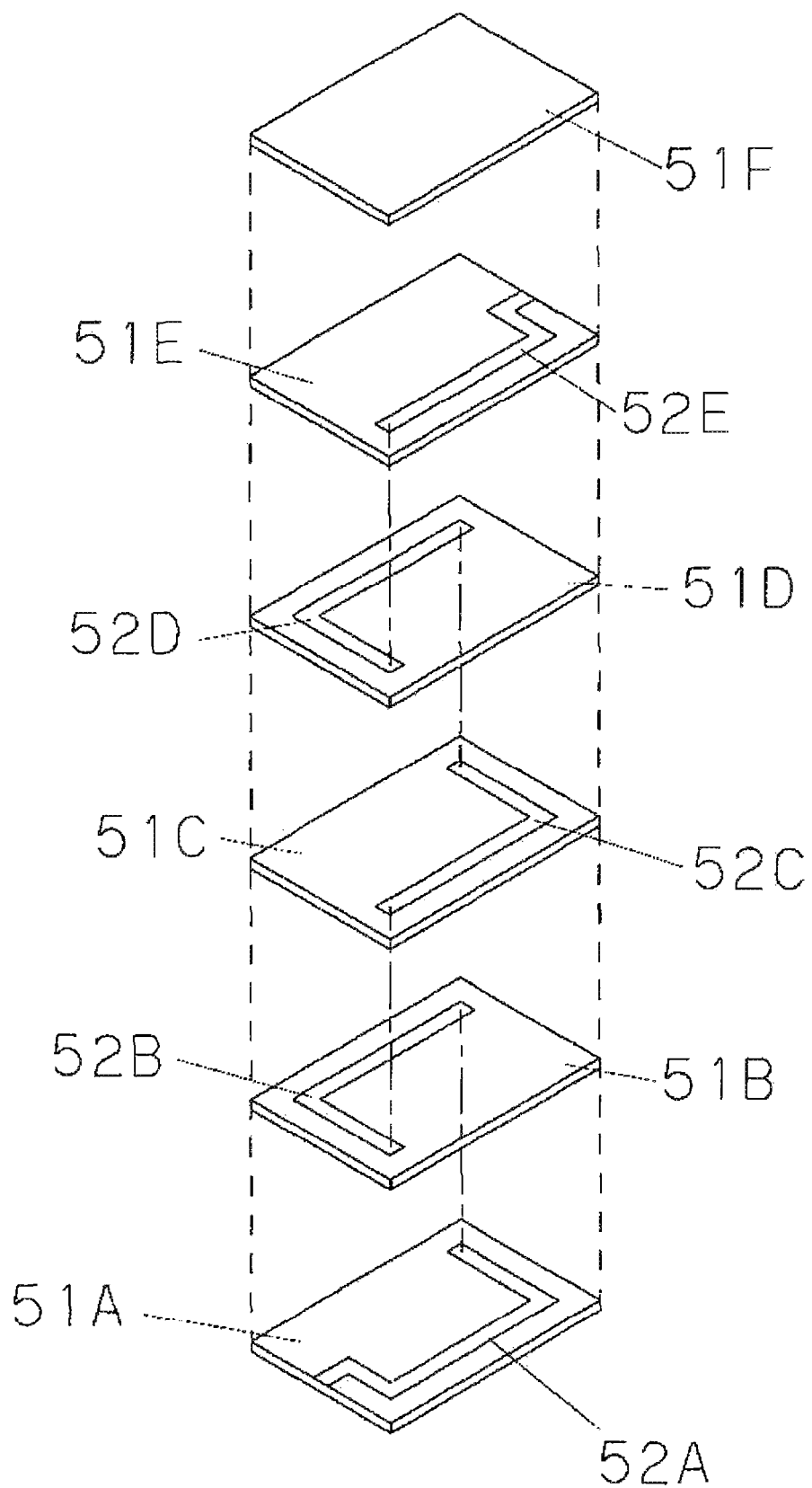
FIG. 5 is an exploded perspective view of a conventional laminated electronic component.
Figure 6:
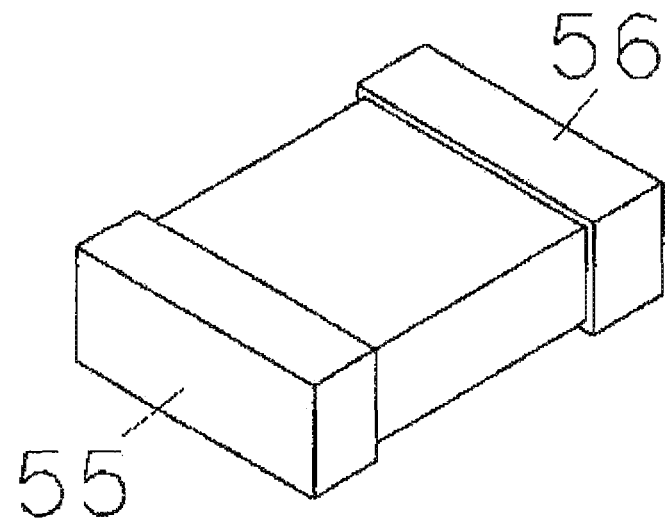
FIG. 6 is a perspective view of the conventional laminated electronic component.

Furthermore, since the laminated electronic component of the present disclosure has no external terminal formed on the side surface, the volume of the laminated body can be made larger than that of the conventional laminated electronic component shown in FIGS. 5 and 6 by the volume of the external terminal and the insulator film on the side surface, which reduces the magnetic flux density per unit volume, so that the characteristics can be improved.

Embodiments

Embodiments of the laminated electronic component of the present disclosure will now be described with reference to FIGS. 1 to 4.

FIG. 1 is an exploded perspective view of a first embodiment of the laminated electronic component of the present disclosure.

In FIG. 1, reference numerals 10, 11A to 11G, and 12A to 12E denote a laminated body, magnetic material layers, and conductor patterns, respectively. The laminated body 10 has a bottom surface orthogonal to a lamination direction and having an external terminal disposed thereon, and four side surfaces adjacent to the bottom surface and parallel to the lamination direction. The four side surfaces are two longitudinal-direction side surfaces perpendicular to the longitudinal direction of the rectangular magnetic material layers and two lateral-direction side surfaces parallel to the longitudinal direction of the magnetic material layers.

The laminated body 10 is formed by laminating the magnetic material layers 11A to 11G and the conductor patterns 12A to 12E. The magnetic material layers 11A to 11G are made of a metal magnetic material such as metal magnetic powder of Fe, Si, Fe—Si—Cr, Fe—Si—Al, Fe—Ni—Al, Fe—Cr—Al, amorphous, etc. The conductor patterns 12A to 12E are made of a conductor paste that is a metal material such as silver, silver-based material, gold, gold-based material, copper, copper-based material, etc. made into a paste form.

The magnetic material layer 11A is formed into a rectangular sheet shape and has a first through hole formed at a position corresponding to, out of two lead-out ends of a coil pattern described later, a first end portion close to a bottom surface of the laminated body and a second through-hole formed at a position corresponding to a second end portion distant from the bottom surface of the laminated body. Furthermore, a third through-hole is formed between a portion close to the second through-hole corresponding to the conductor pattern 12A described later and the second through-hole. Conductors 13, 14A having the same thickness as the magnetic material layer 11A are formed in the through-holes (the first through-hole and the second through-hole) of the magnetic material layer 11A at the positions corresponding to the lead-out ends of the coil pattern. The conductors 13, 14A are formed by printing using the same material as the material forming the conductor pattern. Additionally, an insulator part 17A is formed in the third through-hole formed between the second through-hole and the portion close to the second through-hole corresponding to the conductor pattern 12A. The insulator part 17A is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11A.

The magnetic material layer 11B is formed into a rectangular sheet shape and has a first through-hole formed at a position corresponding to the first end portion and the conductor 13, a second through-hole formed at a position corresponding to the second end portion of the coil pattern, and a third through-hole formed between the second through-hole and a portion of the conductor pattern 12A described later close to the second through-hole. A conductor 14B having the same thickness as the magnetic material layer 11B is formed in the second through-hole of the magnetic material layer 11B. The conductor 14B is formed by printing using the same material as the material forming the conductor pattern 12A described later. A conductor is also formed in the first through-hole of the magnetic material layer 11B in the same way (not shown). The conductor pattern 12A is formed on an upper surface of the magnetic material layer 11B (the surface on the side opposite to the bottom surface of the laminated body 10). This conductor pattern 12A is formed for less than one turn and has the first end portion connected to the conductor 13 via the conductor in the through-hole formed in the magnetic material layer 11B. In the third through-hole, an insulator part 17B is formed having a thickness that is the sum of the thickness of the magnetic material layer 11B and the thickness of the conductor pattern 12A. The insulator part 17B is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11B.

The magnetic material layer 11C is formed into a rectangular sheet shape and has a second through-hole formed at a position corresponding to the second end portion of the coil pattern, a third through-hole formed between the second through-hole and a portion close to the second through-hole corresponding to the conductor pattern 12A described later, and a first through-hole formed at a position corresponding to the other end of the conductor pattern 12A different from the first end portion. A conductor 14C having the same thickness as the magnetic material layer 11C is formed in the second through-hole of the magnetic material layer 11C. The conductor 14C is formed by printing using the same material as the conductor pattern 12B described later. A conductor is also formed in the first through-hole of the magnetic material layer 11C in the same way (not shown). The conductor pattern 12B is formed on the upper surface of the magnetic material layer 11C. This conductor pattern 12B is formed for less than one turn and has one end connected to the other end of the conductor pattern 12A via the conductor in the first through-hole formed in the magnetic material layer 11C. In the third through-hole, an insulator part 17C is formed having a thickness that is the sum of the thickness of the magnetic material layer 11C and the thickness of the conductor pattern 12B. The insulator part 17C is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11C.

The magnetic material layer 11D is formed into a rectangular sheet shape and has a second through-hole formed at a position corresponding to the second end portion of the coil pattern, a third through-hole formed between the second through-hole and a portion of the conductor pattern 12C described later close to the second through-hole, and a first through-hole formed at a position corresponding to the other end of the conductor pattern 12B. A conductor 14D having the same thickness as the magnetic material layer 11D is formed in the second through-hole of the magnetic material layer 11D. The conductor 14D is formed by printing using the same material as the conductor pattern 12C described later. A conductor is also formed in the first through-hole of the magnetic material layer 11D in the same way (not shown). The conductor pattern 12C is formed on the upper surface of the magnetic material layer 11D. This conductor pattern 12C is formed for less than one turn and has one end connected to the other end of the conductor pattern 12B via the conductor in the first through-hole formed in the magnetic material layer 11D. In the third through-hole, an insulator part 17D is formed having a thickness that is the sum of the thickness of the magnetic material layer 11D and the thickness of the conductor pattern 12C. The insulator part 17D is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11D.

The magnetic material layer 11E is formed into a rectangular sheet shape and has a second through-hole formed at a position corresponding to the second end portion of the coil pattern, a third through-hole formed between the second through-hole and a portion close to the second through-hole corresponding to the conductor pattern 12C, and a first through-hole formed at a position corresponding to the other end of the conductor pattern 12C. A conductor 14E having the same thickness as the magnetic material layer 11E is formed in the second through-hole of the magnetic material layer 11E. The conductor 14E is formed by printing using the same material as the conductor pattern 12D described later. A conductor is also formed in the first through-hole of the magnetic material layer 11E in the same way (not shown). The conductor pattern 12D is formed on the upper surface of the magnetic material layer 11E. This conductor pattern 12D is formed for less than one turn and has one end connected to the other end of the conductor pattern 12C via the conductor in the through-hole formed in the magnetic material layer 11E. In the third through-hole, an insulator part 17E is formed having a thickness that is the sum of the thickness of the magnetic material layer 11E and the thickness of the conductor pattern 12D. The insulator part 17E is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11E.

The magnetic material layer 11F is formed into a rectangular sheet shape and has a second through-hole formed at a position corresponding to the second end portion of the coil pattern, a third through-hole formed between the second through-hole and a portion close to the second through-hole at a position corresponding to the conductor pattern 12C, and a first through-hole formed at a position corresponding to the other end of the conductor pattern 12D. Respective conductors having the same thickness as the magnetic material layer 11F are formed in the first through-hole and the second through-hole of the magnetic material layer 11F. The conductors are formed by printing using the same material as the conductor pattern 12E described later. An insulator part 17F having the same thickness as the magnetic material layer 11E is formed in the third through-hole. The insulator part 17F is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11F. The conductor pattern 12E is formed on the upper surface of the magnetic material layer 11F. This conductor pattern 12E is formed for less than one turn and has one end connected to the other end of the conductor pattern 12D via the conductor in the first through-hole formed in the magnetic material layer 11F and the other end connected to the conductor 14E via the conductor in the second through-hole formed in the magnetic material layer 11F.

The magnetic material layer 11G for protecting the conductor pattern is formed on the magnetic material layer 11F having the conductor pattern 12E formed thereon.

Figure 2:
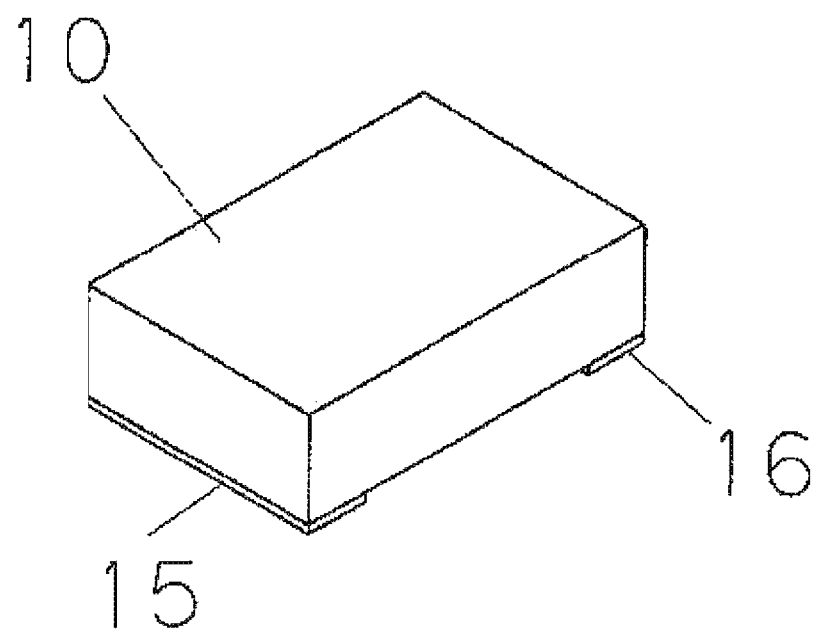
FIG. 2 is a perspective view of the first embodiment of the laminated electronic component of the present disclosure.

By spirally connecting the conductor patterns 12A to 12E between the magnetic material layers in this way, the coil pattern is formed in the laminated body. In this laminated body 10, the respective conductors connected to the first end portion and the second end portion of the coil pattern have surfaces partially exposed on the bottom surface. In this case, the conductor connected to the second end portion of the coil pattern extends in the lamination direction of the magnetic material layers between the bottom surface of the laminated body 10 and the second end portion. This laminated body 10 has a pair of external terminals 15, 16 formed on the bottom surface as shown in FIG. 2, and both of the lead-out ends of the coil pattern are respectively connected via the conductors so that a coil is connected between the paired external terminals 15, 16.

In this laminated body 10, between the conductor connected to the second end portion and the coil pattern, an insulator part is formed that extends in the lamination direction of the magnetic material layers from a surface of the second end portion of the coil pattern on the bottom surface side of the laminated body to the bottom surface of the laminated body. As a result, better insulation and withstand voltage characteristics can be achieved.

The laminated electronic component formed in this way has an inductance of 1 μH, a DC resistance value (Rdc) of 205 mΩ, and a rated current (Isat) of 1.64 A as the current value at −30% inductance relative to the inductance without a load when DC superimposition characteristics of an inductor are measured. Since the conventional laminated electronic component shown in FIGS. 3 and 4 has the values of 1.03 μH, 212 mΩ, and 1.58 A, respectively, and the conventional laminated electronic component shown in FIGS. 5 and 6 has the values of 1.03 μH, 205 mΩ, and 1.60 A, respectively, the laminated electronic component of the present disclosure has excellent DC superimposition characteristics and high insulation and withstand voltage characteristics as compared to the conventional laminated electronic components.

The inductance and the DC superimposition characteristics were measured by using LCR Meter 4285A, and the DC resistance value was measured by using Milliohm Meter 4338B.

Figure 3:
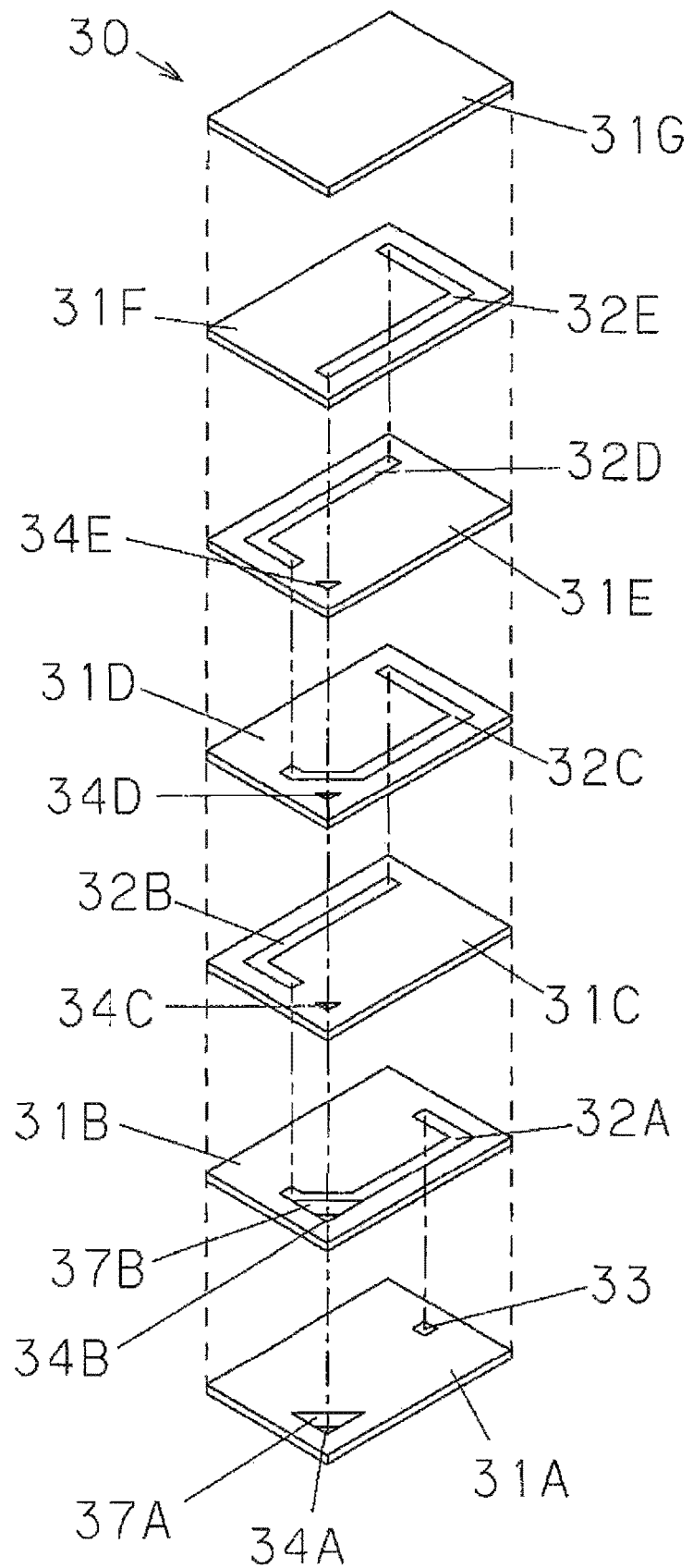
FIG. 3 is an exploded perspective view of a second embodiment of the laminated electronic component of the present disclosure.

FIG. 3 is an exploded perspective view of a second embodiment of the laminated electronic component of the present disclosure. In the second embodiment, an insulator part is partially disposed on the bottom surface side of the laminated electronic component. As a result, better DC superimposition characteristics and better insulation and withstand voltage characteristics can be achieved.

A magnetic material layer 31A is formed into a rectangular sheet shape and has respective through-holes formed at positions corresponding to two lead-out ends of a coil pattern described later. In particular, a first through-hole is formed at a position corresponding to, out of the two lead-out ends, a first end portion close to a bottom surface of a laminated body, and a second through-hole is formed at a position corresponding to a second end portion distant from the bottom surface of the laminated body. Furthermore, a third through-hole is formed between the second through-hole and a portion close to the second through-hole corresponding to a conductor pattern 32A described later. Conductors 33, 34A having the same thickness as the magnetic material layer 31A are formed in the through-holes (the first through-hole and the second through-hole) of the magnetic material layer 31A at the positions corresponding to the lead-out ends of the coil pattern. The conductors 33, 34A are formed by printing using the same material as the material forming the conductor pattern. Additionally, an insulator part 37A is formed in the third through-hole. The insulator part 37A is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 31A.

A magnetic material layer 31B is formed into a rectangular sheet shape and has a second through-hole formed at a position corresponding to the second end portion of the coil pattern and a third through-hole formed between the second through-hole and a portion of the conductor pattern 32A described later close to the second through-hole. A conductor 34B having the same thickness as the magnetic material layer 31B is formed in the second through-hole of the magnetic material layer 31B. The conductor 34B is formed by printing using the same material as the material forming the conductor pattern 32A. A conductor is also formed in a first through-hole of the magnetic material layer 31B in the same way (not shown). The conductor pattern 32A is formed on the upper surface of the magnetic material layer 31B. This conductor pattern 32A is formed for less than one turn and has one end connected to the conductor 33 via the conductor in the first through-hole formed in the magnetic material layer 31B. In the third through-hole, an insulator part 37B is formed having a thickness that is the sum of the thickness of the magnetic material layer 31B and the thickness of the conductor pattern 32A. The insulator part 37B is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 31B.

A magnetic material layer 31C is formed into a rectangular sheet shape and has a second through-hole formed at a position corresponding to the second end portion of the coil pattern and a first through-hole formed at a position corresponding to the other end of the conductor pattern 32A. A conductor 34C having the same thickness as the magnetic material layer 31C is formed in the second through-hole of the magnetic material layer 31C. The conductor 34C is formed by printing using the same material as the material forming a conductor pattern 32B described later. A conductor is also formed in the first through-hole of the magnetic material layer 31C in the same way (not shown). The conductor pattern 32B is formed on the upper surface of the magnetic material layer 31C. This conductor pattern 32B is formed for less than one turn and has one end connected to the other end of the conductor pattern 32A via the conductor in the first through-hole formed in the magnetic material layer 31C.

A magnetic material layer 31D is formed into a rectangular sheet shape and has a second through-hole formed at a position corresponding to the second end portion of the coil pattern and a first through-hole formed at a position corresponding to the other end of the conductor pattern 32B. A conductor 34D having the same thickness as the magnetic material layer 31D is formed in the second through-hole of the magnetic material layer 31D. The conductor 34D is formed by printing using the same material as the material forming a conductor pattern 32C described later. A conductor is also formed in the first through-hole of the magnetic material layer 31D in the same way (not shown). The conductor pattern 32C is formed on the upper surface of the magnetic material layer 31D. This conductor pattern 32C is formed for less than one turn and has one end connected to the other end of the conductor pattern 32B via the conductor in the through-hole formed in the magnetic material layer 31D.

A magnetic material layer 31E is formed into a rectangular sheet shape and has a second through-hole formed at a position corresponding to the second end portion of the coil pattern and a first through-hole formed at a position corresponding to the other end of the conductor pattern 32C. A conductor 34E having the same thickness as the magnetic material layer 31E is formed in the second through-hole of the magnetic material layer 31E. The conductor 34E is formed by printing using the same material as the material forming a conductor pattern 32D described later. A conductor is also formed in the first through-hole of the magnetic material layer 31E in the same way (not shown). The conductor pattern 32D is formed on the upper surface of the magnetic material layer 31E. This conductor pattern 32D is formed for less than one turn and has one end connected to the other end of the conductor pattern 32C via the conductor in the through-hole formed in the magnetic material layer 31E.

A magnetic material layer 31F is formed into a rectangular sheet shape and has a second through-hole formed at a position corresponding to the second end portion of the coil pattern and a first through-hole formed at a position corresponding to the other end of the conductor pattern 32D. Respective conductors having the same thickness as the magnetic material layer 31F are formed in the first through-hole and the second through-hole of the magnetic material layer 31F. The conductors are formed by printing using the same material as a conductor pattern 32E described later. The conductor pattern 32E is formed on the upper surface of the magnetic material layer 31F. This conductor pattern 32E is formed for less than one turn and has one end connected to the other end of the conductor pattern 32D via the conductor in the first through-hole formed in the magnetic material layer 31F and the other end connected to the conductor 34E via the conductor in the second through-hole formed in the magnetic material layer 31F.

A magnetic material layer 31G for protecting the conductor pattern is formed on the magnetic material layer 31F having the conductor pattern 32E formed thereon.

By spirally connecting the conductor patterns 32A to 32E between the magnetic material layers in this way, the coil pattern is formed in the laminated body. In this laminated body 30, the respective conductors connected to the first end portion and the second end portion of the coil pattern have surfaces partially exposed on the bottom surface. In this case, the conductor connected to the second end portion of the coil pattern extends in the lamination direction of the magnetic material layers between the bottom surface of the laminated body 30 and the second end portion. This laminated body 30 has a pair of the external terminals 15, 16 formed on the bottom surface as shown in FIG. 2, and the two lead-out ends (the first end portion and the second end portion) of the coil pattern are respectively connected via the conductors so that a coil is connected between the paired external terminals 15, 16.

In this laminated body 30, between the conductor connected to the second end portion and the coil pattern, an insulator part is formed that extends in the lamination direction of the magnetic material layers from the bottom surface of the laminated body 30 to the first layer of the coil pattern, i.e., from a surface of the conductor pattern 32A having the first end portion of the coil pattern on the side opposite to the bottom surface side of the laminated body to the bottom surface of the laminated body.

Figure 4:
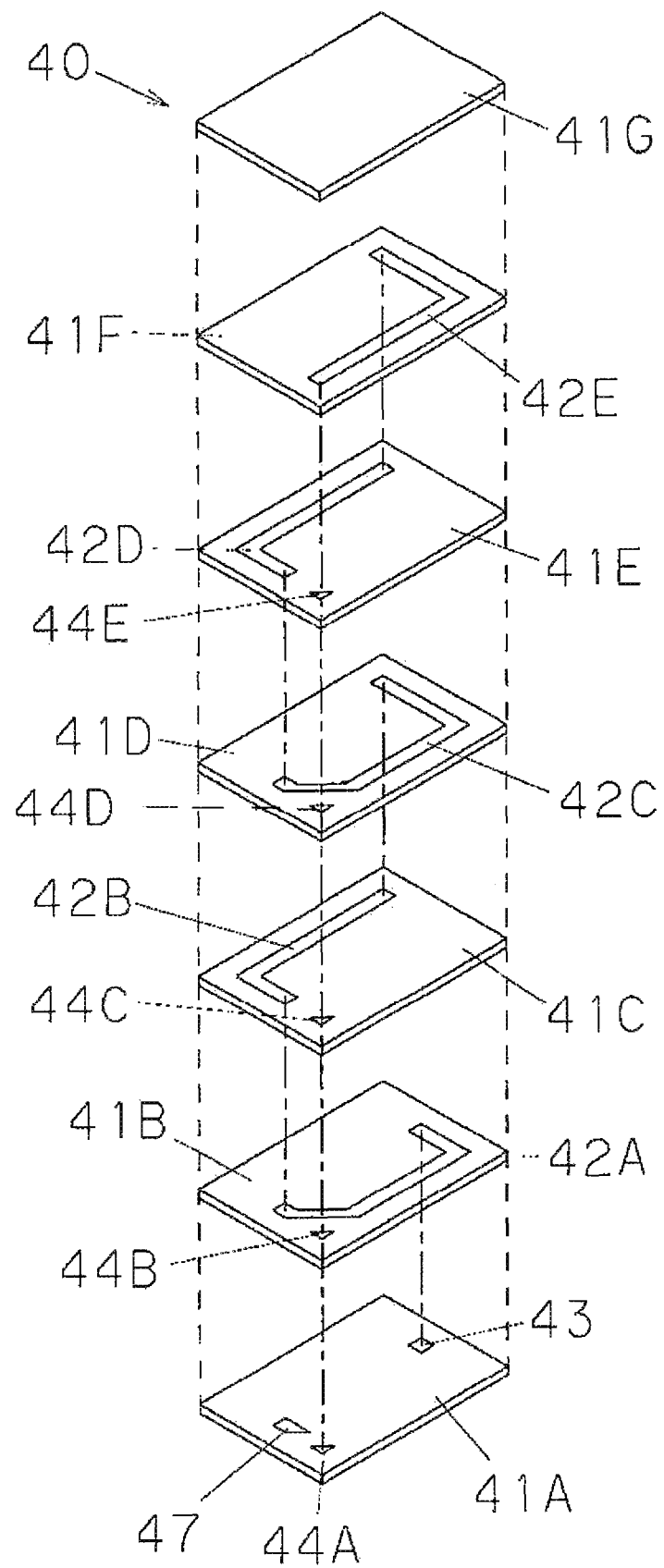
FIG. 4 is an exploded perspective view of a third embodiment of the laminated electronic component of the present disclosure.

FIG. 4 is an exploded perspective view of a third embodiment of the laminated electronic component of the present disclosure. In the third embodiment, an insulator part is disposed between a coil and an external terminal. As a result, better DC superimposition characteristics and better insulation and withstand voltage characteristics can be achieved.

A magnetic material layer 41A is formed into a rectangular sheet shape and has respective through-holes formed at positions corresponding to two lead-out ends of a coil pattern described later. In particular, a first through-hole is formed at a position corresponding to, out of the two lead-out ends, a first end portion close to a bottom surface of a laminated body, and a second through-hole is formed at a position corresponding to a second end portion distant from the bottom surface of the laminated body. A conductor 43 and a conductor 44A both having the same thickness as the magnetic material layer 41A are formed in the first through-hole and the second through-hole, respectively. The conductors 43, 44A are formed by printing using the same material as the material forming the conductor pattern. Additionally, this magnetic material layer 41A has a third through-hole formed at least at a position where a conductor pattern 42A described later and an external terminal described later face each other. An insulator part 47 is formed in the third through-hole. The insulator part 47 is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 41A.

A magnetic material layer 41B is formed into a rectangular sheet shape and has a second through-hole formed at a position corresponding to the second end portion of the coil pattern and a first through-hole formed at a position corresponding to the conductor 43. A conductor 44B having the same thickness as the magnetic material layer 41B is formed in the second through-hole of the magnetic material layer 41B. The conductor 44B is formed by printing using the same material as the material forming the conductor pattern 42A described later. A conductor is also formed in the first through-hole of the magnetic material layer 41B in the same way (not shown). The conductor pattern 42A is formed on the upper surface of the magnetic material layer 41B. This conductor pattern 42A is formed for less than one turn and has one end connected to the conductor 43 via the conductor in the first through-hole formed in the magnetic material layer 41B.

A magnetic material layer 41C is formed into a rectangular sheet shape and has a second through-hole formed at a position corresponding to the second end portion of the coil pattern and a first through-hole formed at a position corresponding to the other end of the conductor pattern 42A. A conductor 44C having the same thickness as the magnetic material layer 41C is formed in the second through-hole of the magnetic material layer 41C. The conductor 44C is formed by printing using the same material as the material forming a conductor pattern 42B described later. A conductor is also formed in the first through-hole of the magnetic material layer 41C in the same way (not shown). The conductor pattern 42B is formed on the upper surface of the magnetic material layer 41C. This conductor pattern 42B is formed for less than one turn and has one end connected to the other end of the conductor pattern 42A via the conductor in the first through-hole formed in the magnetic material layer 41C.

A magnetic material layer 41D is formed into a rectangular sheet shape and has a second through-hole formed at a position corresponding to the second end portion of the coil pattern and a first through-hole formed at a position corresponding to the other end of the conductor pattern 42B. A conductor 44D having the same thickness as the magnetic material layer 41D is formed in the second through-hole of the magnetic material layer 41D. The conductor 44D is formed by printing using the same material as the material forming a conductor pattern 42C described later. A conductor is also formed in the first through-hole of the magnetic material layer 41D in the same way (not shown). The conductor pattern 42C is formed on the upper surface of the magnetic material layer 41D. This conductor pattern 42C is formed for less than one turn and has one end connected to the other end of the conductor pattern 42B via the conductor in the first through-hole formed in the magnetic material layer 41D.

A magnetic material layer 41E is formed into a rectangular sheet shape and has a through-hole formed at a position corresponding to the second end portion of the coil pattern and a first through-hole formed at a position corresponding to the other end of the conductor pattern 42C. A conductor 44E having the same thickness as the magnetic material layer 41E is formed in the second through-hole of the magnetic material layer 41E. The conductor 44E is formed by printing using the same material as the material forming a conductor pattern 42D described later. A conductor is also formed in the first through-hole of the magnetic material layer 41E in the same way (not shown). The conductor pattern 42D is formed on the upper surface of the magnetic material layer 41E. This conductor pattern 42D is formed for less than one turn and has one end connected to the other end of the conductor pattern 42C via the conductor in the first through-hole formed in the magnetic material layer 41E.

A magnetic material layer 41F is formed into a rectangular sheet shape and has a second through-hole formed at a position corresponding to the second end portion of the coil pattern and a first through-hole formed at a position corresponding to the other end of the conductor pattern 42D. Conductors having the same thickness as the magnetic material layer 41F are formed in the first through-hole and the second through-hole of the magnetic material layer 41F. The conductors are formed by printing using the same material as the material forming a conductor pattern 42E described later. The conductor pattern 42E is formed on the upper surface of the magnetic material layer 41F. This conductor pattern 42E is formed for less than one turn and has one end connected to the other end of the conductor pattern 42D via the conductor in the first through-hole formed in the magnetic material layer 41F and the other end connected to the conductor 44E via the conductor in the second through-hole formed in the magnetic material layer 41F.

A magnetic material layer 41G for protecting the conductor pattern is formed on the magnetic material layer 41F having the conductor pattern 42E formed thereon.

By spirally connecting the conductor patterns 42A to 42E between the magnetic material layers in this way, the coil pattern is formed in the laminated body. In this laminated body 40, the respective conductors connected to the first end portion and the second end portion of the coil pattern have surfaces partially exposed on the bottom surface. In this case, the conductor connected to the second end portion of the coil pattern extends in the lamination direction of the magnetic material layers between the bottom surface of the laminated body 40 and the second end portion. This laminated body 40 has a pair of the external terminals 15, 16 formed on the bottom surface as shown in FIG. 2, and the two lead-out ends (the first end portion and the second end portion) of the coil pattern are respectively connected via the conductors so that a coil is connected between the paired external terminals 15, 16. In this laminated body 40, an insulator part is formed between the coil pattern and the external terminal.

Although the embodiments of the laminated electronic component of the present disclosure have been described, the present disclosure is not limited to the embodiments. For example, in the embodiments, the external terminals are formed on the bottom surface of the laminated body such that the terminals are visible from the side surfaces; however, the external terminals may be formed on the bottom surface of the laminated body away from the sides adjacent to the side surfaces such that the terminals are invisible from the side surfaces. In the embodiments, the bottom surface of the laminated body may be provided with an insulator layer formed of an insulating material, for example, a dielectric material such as glass and glass ceramics, a magnetic material such as ferrite, or a nonmagnetic material, and the external terminals may be formed on the insulator layer. In this case, the insulator layer may be made of a material higher in volume resistivity and withstand voltage than the material constituting the laminated body.

In the first embodiment, the insulator part is in contact with the laminated-body bottom surface side of the lead-out end of the coil pattern distant from the bottom surface of the laminated body and extends to the bottom surface of the laminated body in the description; however, the insulator part may be disposed between the coil pattern and the conductor connecting the lead-out end of the coil pattern distant from the bottom surface of the laminated body to the external terminal and therefore can be changed in position, shape, size, etc. depending on a portion having a large potential difference by being formed on the side of the lead-out end of the coil pattern distant from the bottom surface of the laminated body in contact with the lead-out end of the coil pattern distant from the bottom surface of the laminated body or by being formed partially between the lead-out end of the coil pattern distant from the bottom surface of the laminated body and the bottom surface of the laminated body.

In the second embodiment, the insulator part is formed between the coil pattern and the conductor connecting the lead-out end of the coil pattern distant from the bottom surface of the laminated body to the external terminal, from the bottom surface of the laminated body to the first layer of the coil pattern in the description; however, the insulator part may be formed in a portion of the coil pattern on the bottom surface side of the laminated body and may be formed from the bottom surface of the laminated body to an arbitrary height such as a second layer and a third layer of the coil pattern.

In the third embodiment, the insulator part is formed on the other end portion side of the conductor pattern into the same shape as the conductor pattern; however, the insulator part can be changed in position, shape, size, etc. depending on a portion having a large potential difference.

It is to be understood that although the present disclosure has been described with regard to preferred embodiments thereof, various other embodiments and variants may occur to those skilled in the art, which are within the scope and spirit of the disclosure, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A laminated electronic component comprising
   a coil,
   a laminated body, and
   an insulator part, wherein
   the coil is formed in the laminated body of pluralities of laminated magnetic material layers and conductor patterns by electrically connecting the conductor patterns adjacent to each other via the magnetic material layers,
   the magnetic material layers contain a metal magnetic material, the coil has a first end portion close to a bottom surface of the laminated body and a second end portion distant from the bottom surface of the laminated body, the first end portion is electrically connected to a first external terminal disposed on the bottom surface of the laminated body, the second end portion is electrically connected to a second external terminal disposed on the bottom surface of the laminated body via a conductor extending in a lamination direction of the laminated body, the insulator part is disposed between the conductor and the coil, the conductor is disposed in contact with the magnetic material on a side of the conductor that is opposite to the coil, and the insulator is disposed only along sides of the conductor that face the coil.

2. The laminated electronic component according to claim 1, wherein the insulator part is disposed in contact with a surface of the second end portion facing the bottom surface of the laminated body.

3. The laminated electronic component according to claim 1, wherein the insulator part is disposed in contact with a surface of the second end portion facing the bottom surface of the laminated body and extended to the bottom surface of the laminated body in the lamination direction of the laminated body.

4. The laminated electronic component according to claim 1, wherein the insulator part is disposed on the side of the conductor pattern closest to the laminated-body bottom surface in the laminated body.

5. The laminated electronic component according to claim 1, wherein an insulator layer is disposed in contact with the bottom surface of the laminated body, and wherein at least one of the first external terminal and the second external terminal is disposed on the insulating layer.

6. The laminated electronic component according to claim 2, wherein an insulator layer is disposed in contact with the bottom surface of the laminated body, and wherein at least one of the first external terminal and the second external terminal is disposed on the insulating layer.

7. The laminated electronic component according to claim 3, wherein an insulator layer is disposed in contact with the bottom surface of the laminated body, and wherein at least one of the first external terminal and the second external terminal is disposed on the insulating layer.

8. The laminated electronic component according to claim 4, wherein an insulator layer is disposed in contact with the bottom surface of the laminated body, and wherein at least one of the first external terminal and the second external terminal is disposed on the insulating layer.

9. The laminated electronic component according to claim 1, wherein the conductor is bordered on at least two sides by the magnetic material.

10. The laminated electronic component according to claim 1, wherein the insulator part is made of a material higher in volume resistivity than a material constituting the magnetic material layer.

* * * * *